(12) United States Patent
Chen et al.

(10) Patent No.: US 10,685,950 B2
(45) Date of Patent: Jun. 16, 2020

(54) PHOTOMASK DESIGN FOR GENERATING PLASMONIC EFFECT

(71) Applicant: Taiwan Semiconductor Manufacturing Co., Ltd., Hsinchu (TW)

(72) Inventors: Minfeng Chen, Hsinchu (TW); Shuo-Yen Chou, Hualien County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 210 days.

(21) Appl. No.: 15/638,010

(22) Filed: Jun. 29, 2017

(65) Prior Publication Data
US 2019/0006343 A1 Jan. 3, 2019

(51) Int. Cl.
*G06F 17/50* (2006.01)
*H01L 27/02* (2006.01)
*G03F 7/20* (2006.01)
*G03F 1/36* (2012.01)
*G03F 1/00* (2012.01)
*G03F 1/54* (2012.01)

(52) U.S. Cl.
CPC ........... *H01L 27/0207* (2013.01); *G03F 1/14* (2013.01); *G03F 1/36* (2013.01); *G03F 1/54* (2013.01); *G03F 7/2002* (2013.01); *G03F 7/70125* (2013.01); *G03F 7/70283* (2013.01); *G03F 7/70441* (2013.01); *G03F 7/70566* (2013.01); *G03F 7/70958* (2013.01)

(58) Field of Classification Search
CPC ........... H01L 27/0207; G03F 7/70125; G03F 7/70283; G03F 7/70958; G03F 1/54; G03F 7/70566; G03F 1/14; G03F 1/36; G03F 7/2002; G03F 7/70441
USPC .................................. 716/50–56; 430/5, 30
See application file for complete search history.

(56) References Cited

U.S. PATENT DOCUMENTS

| | | | |
|---|---|---|---|
| 7,488,940 B2 * | 2/2009 | Ohtake | G01N 21/552 250/341.3 |
| 8,762,900 B2 | 6/2014 | Shin et al. | |
| 8,796,666 B1 | 8/2014 | Huang et al. | |
| 8,812,999 B2 | 8/2014 | Liu et al. | |
| 8,850,366 B2 | 9/2014 | Liu et al. | |
| 8,906,595 B2 | 12/2014 | Liu et al. | |
| 8,954,899 B2 | 2/2015 | Wu et al. | |
| 9,093,530 B2 | 4/2015 | Huang et al. | |
| 9,367,655 B2 | 6/2016 | Shih et al. | |

(Continued)

OTHER PUBLICATIONS

'Surface plasmon', (Wikipedia, the online encyclopedia) [online][retrieved on Feb. 16, 2017]. Retrieved from the internet: <URL: https://en.wikipedia.org/wiki/Surface_plasmon>.

(Continued)

*Primary Examiner* — Nghai M Doan
(74) *Attorney, Agent, or Firm* — Haynes and Boone, LLP

(57) ABSTRACT

A method includes providing a photomask having a patterned absorption layer over a substrate. The photomask is irradiated with a beam having a mixture of transverse electronic (TE) waves and transverse magnetic (TM) waves. The irradiating includes generating surface plasmonic polaritons (SPP) on a sidewall of the patterned absorption layer. The SPP is used to suppress the TM waves while reflecting the TE waves. A target substrate is exposed to TE waves.

20 Claims, 9 Drawing Sheets

(56) References Cited

U.S. PATENT DOCUMENTS

| | | | |
|---|---|---|---|
| 9,390,217 B2 | 7/2016 | Wang et al. | |
| 9,548,303 B2 | 1/2017 | Lee et al. | |
| 2006/0110693 A1* | 5/2006 | Kuroda | B82Y 10/00 |
| | | | 430/394 |
| 2012/0257204 A1* | 10/2012 | Walters | G01N 21/553 |
| | | | 356/445 |
| 2014/0139809 A1* | 5/2014 | Natsumeda | G03B 21/2033 |
| | | | 353/20 |
| 2018/0131311 A1* | 5/2018 | Karalis | H01L 31/04 |

OTHER PUBLICATIONS

'Surface Plasmon Polaritons at Metal / Insulator Interfaces' [online]. Springer, 2007, vol. XXVI, Chapter 2, pp. 21-37. Retrieved from the Internet: <URL: http://www.springer.com/978-0-387-33150-8>. ISBN:978-0-387-3150-8.

'Optics basics: surface plasmons' (Skulls in the Stars, Scientopia) [online] [retrieved on Feb. 16, 2017]. Retrieved from the internet: <URL: http://skullsinthestars.scientopia.org/2010/09/21/optics-basics-surface-plasmons/>.

'Surface plasmon polariton', (Wikipedia, the online encyclopedia) [online][retrieved on Feb. 16, 2017]. Retrieved from the internet: <URL: https://en.wikipedia.org/wiki/Surface_plasmon_polariton>.

'What are surface plasmons?' [online] [retrieved on Feb. 16, 2017] NC State University, 66 pgs. Retrieved from the internet: <URL: http://www4.ncsu.edu/~franzen/public_html/sf/SP.pdf>.

\* cited by examiner

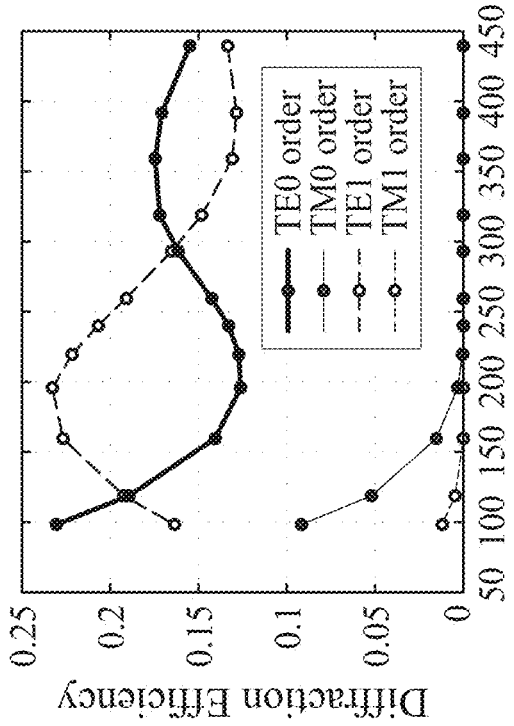
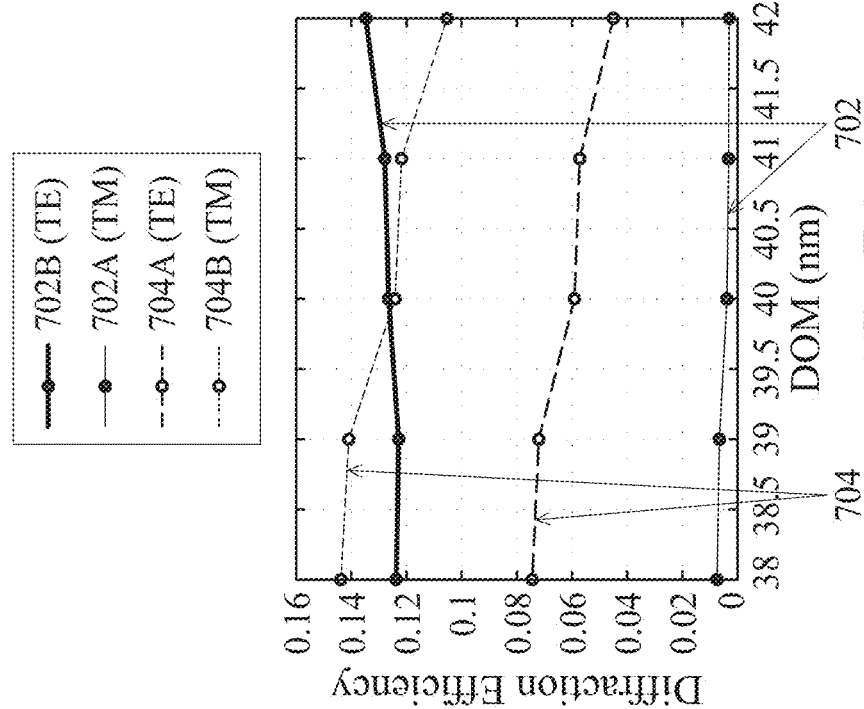
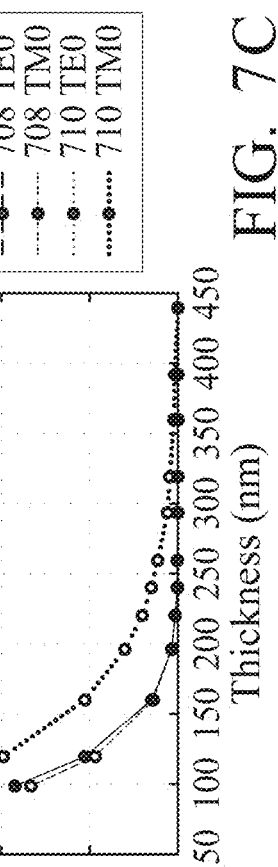
FIG. 7A
FIG. 7B
FIG. 7C

PHOTOMASK DESIGN FOR GENERATING PLASMONIC EFFECT

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or simply masks) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, use of aggressively small wavelengths of radiation, such as extreme ultraviolet (EUV) radiation sources, have been introduced. With all lithography processes, as the patterns shrink, it is desired to maintain or even enhance an image contrast between elements of the pattern to be imaged. While various methods of enhancing image contrast have been developed, they have not been suitable in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, and 7C are exemplary embodiments of data obtained from experimental embodiments some according to aspects of the present disclosure.

DETAILED DESCRIPTION

Figure 1:
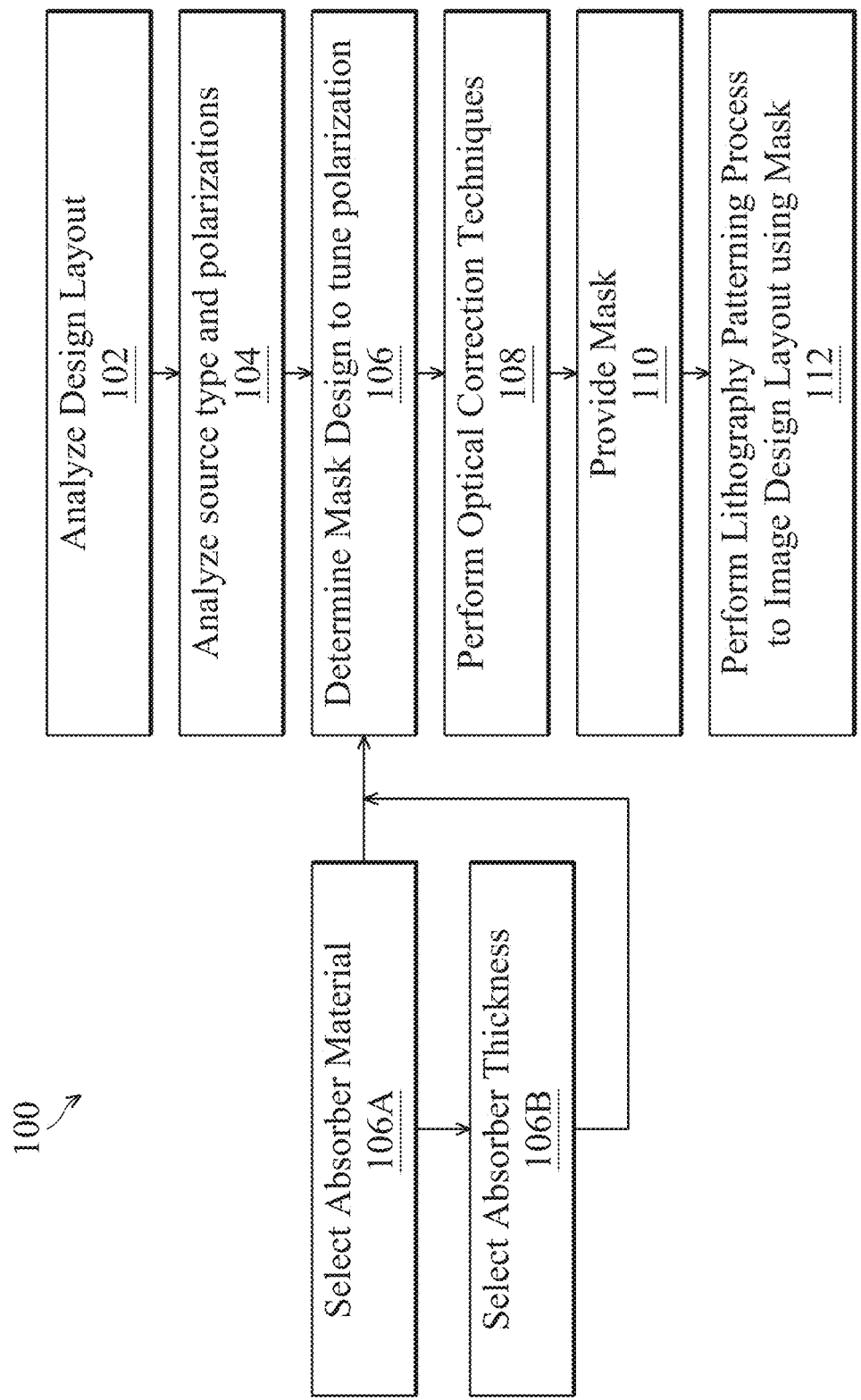
FIG. 1 is a flow chart of an embodiment of a method of determining a lithography element according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as a DUV mask or EUV mask. Similarly, the terms "permittivity" (e.g., relative permittivity $\varepsilon r$), "dielectric constant", and "dielectric function" may also be used interchangeably.

While certain exemplary embodiments are described herein with respect to certain lithography wavelengths, the present disclosure is not limited thereto. For example, any an optical source including ultraviolet (UV) sources, deep UV (DUV) sources, extreme UV (EUV) sources, X-ray sources, and/or other suitable sources now or later developed may be used. To be sure, the radiation source may alternatively include a particle source such as electron beam (E-Beam) sources, ion beam sources, and plasma sources. It is understood that in the above description of radiation sources, each radiation source may have a certain wavelength distribution rather than an exact single wavelength.

As discussed above, there is a desire to enhance lithography image contrast. The present disclosure, in some embodiments, provides for selecting a mask material and/or mask material thickness such that an improved image contrast is provided. In some embodiments, aspects of this improvement are provided by generating a plasmonic effect (SPP) at the material surface, which can block one type of polarization of the incident radiation (e.g., for that location on the mask). (Since most layouts to be imaged consist of irregular features, the light source is commonly emanated with mixed polarizations (e.g., transverse electronic (TE) and transverse magnetic (TM) wave polarizations). At least one of these polarizations is suppressed by the waves generated by plasmonic effect on the surface of the mask material.

For example, transverse magnetic (TM) waves present in the incident radiation may be suppressed, while allowing transverse electronic (TE) waves to be retained and provided to a target substrate. In some embodiments the TE waves can be suitably oriented with respect to the pattern being exposed (e.g., parallel an edge of a feature), this suppression of TM waves and retention of TE waves can enhance the image contrast. That is, the TE waves, where electric fields are oriented along the edges of desired patterns, exhibit better lithographic performance than the TM waves. This polarization selection performed by a mask material layer is discussed in various embodiments herein including selection of composition of material for mask layer and more specifically, its dielectric function, and/or thickness of a mask layer used in the lithography process.

Surface plasmon polaritons (SPP) are propagating electromagnetic wave oscillations that can be excited on surfaces of certain interfaces (e.g., metal surface interfacing with dielectric/air). The wave includes charge motion in the first material (e.g., metal) and an electromagnetic wave outside of the first material—in the second material (e.g., dielectric/air). The wave can be generated where the first and second materials have a change in the real part of the respective dielectric function. Generally, it is recognized that the properties of SPP can be determined from Maxwell's equations. The present disclosure includes methods and devices that provide for generation of desired SPP waves (wavelength) and continues to use these generated waves to suppress a certain polarization of incident radiation.

Polarization is a parameter applying to transverse waves that specifies the geometrical orientation of the oscillations. An electromagnetic wave such as light consists of a coupled oscillating electric field and magnetic field which are always perpendicular. Electromagnetic waves (such as light), traveling in free space or another homogeneous isotropic non-attenuating medium, can be described as transverse waves, meaning that a plane wave's electric field vector and magnetic field are in directions perpendicular to (or "transverse" to) the direction of wave propagation; electric field vector and magnetic field vector are also perpendicular to each other. Thus, the radiation (also referred to as light) from a lithography source can be characterized as having polarization that includes transverse electronic (TE) waves and perpendicular to the TE waves, transverse magnetic (TM) waves.

Referring to FIG. 1, illustrated is a method 100 for determining lithographic elements for use in a lithography process to expose a target substrate according to aspects of the present disclosure. The method 100 includes selecting a mask element or layer such that the mask layer generates and employs surface plasmonic polaritons (SPP) to achieve the desired polarization of the reflected radiation. The SPPs may suppress waves oriented in a certain vector (e.g., TM). Thus, the method 100 may provide for an improved image contrast, such as shown in an aerial image, over typical masks.

The method 100 starts at block 102 where a design layout pattern is determined and/or analyzed. The design layout pattern may be a portion of an integrated circuit device, for example, defining one or more layers of the device where the layer(s) are to be imaged onto a target substrate. In an embodiment, the design layout pattern includes data in polygon form representing the desired pattern. The design layout pattern may define various device features such as, for example, gate features, interconnect features, contact hole patterns, and/or other suitable features.

Figure 2:
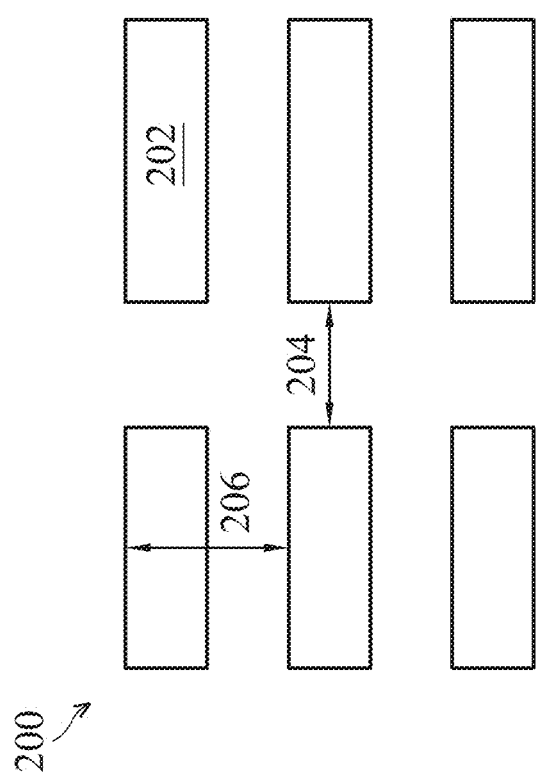
FIG. 2 is an exemplary embodiment of a design pattern subject to processing according to aspects of the present disclosure.

As illustrated in FIG. 2, provided is an exemplary pattern to be imaged onto a target substrate (e.g., semiconductor substrate or wafer). In some embodiments, the exemplary pattern 200 may be referred to as a layout pattern. The layout may be associated with an integrated circuit feature, such as, for example a line-end feature. The pattern 200 includes a plurality of features 202 having an edge-to-edge ("E2E") gap 204 and a pitch (P) 206. In some embodiments, the edge-to-edge gap 204 is considered a "critical" parameter of the pattern (e.g., a more important aspect to maintain fidelity in imaging the pattern 200).

The method 100 then proceeds to block 104 where a lithography process source type (including polarization and wavelength/frequency of the radiation provided from the source type) are determined and/or analyzed. It is noted that block 104 may occur prior to, after, or concurrently with block 102. The source type may be determined from the lithographic technique desired to form the pattern, such as the pattern of block 102. As discussed above, the source type may be that which provides a wavelength suitable for lithography. The source type may be ultraviolet (UV) source, deep UV (DUV) source, extreme UV (EUV) source, X-ray source, electron beam (E-Beam) sources, ion beam sources, plasma sources, and/or other suitable sources.

In addition to the center wavelength of the source, in block 104 the polarization of the radiation from the source is determined. In an embodiment, the source provides radiation having a mixture of polarizations. In some embodiments, the mixture of polarizations includes TE and TM polarizations. In a further embodiment, the TE and TM mixture is approximately equal parts. The pupil shape of the radiation provided from the source (or defined after the source and prior to being incident the mask) may circular, annular, disc, dipole, quasar, and/or other suitable shapes.

Figure 3:
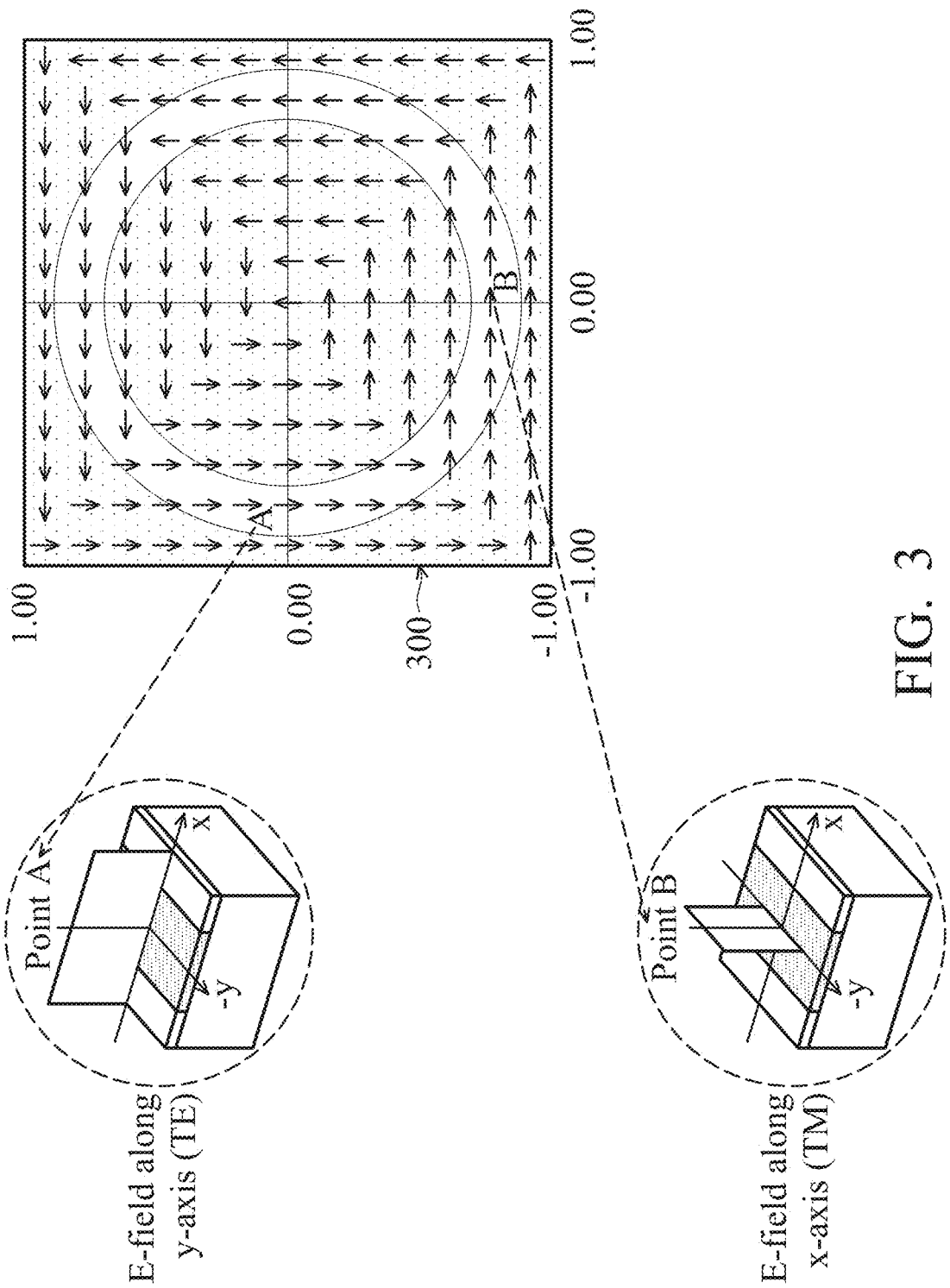
FIG. 3 is an exemplary embodiment of a source map according to aspects of the present disclosure.

As illustrated in FIG. 3, provided is an exemplary source map 300, which illustrates a map associated with an annular source of radiation from a source type. The source map 300 includes a plurality of arrows that indicate the direction of the electric field. The source map 300 illustrates a mixture of TE and TM polarizations. The map 300 may illustrate a sector polarization where for certain sectors or sections of the annular source a given polarization is provided, while overall the source provides a mixture of polarizations, also referred to as sector polarization. The TE and TM waves vary depending on spatial frequency space.

Point A of the map 300 is illustrative of a TE polarization providing an electric field oriented along the y-axis. Point B of the map 300 is illustrative of a TM polarization providing an electric field oriented along an x-axis.

If the exemplary source map 300 of FIG. 3 is used to image the pattern 200 of FIG. 2, mixed TE/TM beams are illuminated onto the pattern (e.g., pattern 200 disposed on a mask). In doing so, the TM polarization will degrade the image contrast especially for the edge-to-edge gap 204. Thus, the method 100 includes steps to mitigate, reduce, and/or eliminate this degradation by tuning the polarization of the radiation. To do, it is desired to produce an electric field that is perpendicular to the critical feature—e.g., the edge-to-edge gap 204. Thus, in some embodiments, to image the pattern 200, it is desired to provide the TE polarization and suppress the TM polarization of the source.

Embodiments of the present disclosure provide for this tuning of the polarization of the radiation from the source to be performed using the mask itself. (For example, not using a separate or distinct lithographic element in the system (such as illustrated FIG. 5).) In an embodiment, the polarization of the radiation incident to/reflected from the mask is altered by selecting and determining a mask design to tune polarization as illustrated in block 106 of the method 100.

The mask design may be selected to tune the polarization through the use of a determined property or properties of a layer of the mask—e.g., an absorption layer. The suppression of the one type of polarization (e.g., TM) occurs due to the high effective index of refraction of the SPP, which are excited on the mask material surface (e.g., absorption layer) only when electric fields are oriented perpendicular to the sidewall of the layer. It is understood to make use of the SPP layers as discussed herein, the mask layer performing the tuning of the polarization—referred to as the absorption layer—has at least one surface exposed to the incident irradiation. In some embodiments, the exposed surface may be or include a sidewall. In some embodiments, the exposed surface is a top surface (e.g., coplanar with a horizontal plane and/or top surface of the substrate). In some embodiments, the exposed surface is both the top surface and a sidewall.

In some embodiments, block 106 includes block 106A where a composition of the absorption material of the mask design is determined. To determine the composition, it may be desired to find the material properly that has the strongest or relatively stronger SPP effect. As discussed above, this SPP effect suppresses or blocks a certain polarization—e.g., TM waves.

As discussed below, the permittivity (also referred to as dielectric function or dielectric constant) of the mask layer (e.g., absorption material) is dependent upon the incident radiation frequency (wavelength). Thus, it is important to take into account the incident radiation to determine a dielectric function that provides the desired SPP generation. Thus, block 106A includes providing an absorption layer material for the mask that provides a suitable dielectric function that provides the desired SPP effect. Since the response of materials to alternating fields is characterized by a complex permittivity, it is understood to be described with respect to its real and imaginary parts. In other words, ε (permittivity)=ε'+iε", where ε' is the real part of the permittivity, which is related to the stored energy within the medium; ε" is the imaginary part of the permittivity, which is related to the dissipation (or loss) of energy within the medium; and i is the imaginary part. Thus, consideration of the real and imaginary part of the dielectric function of the mask material is performed to obtain the desired permittivity is provided in embodiments of block 106A.

Figure 6:
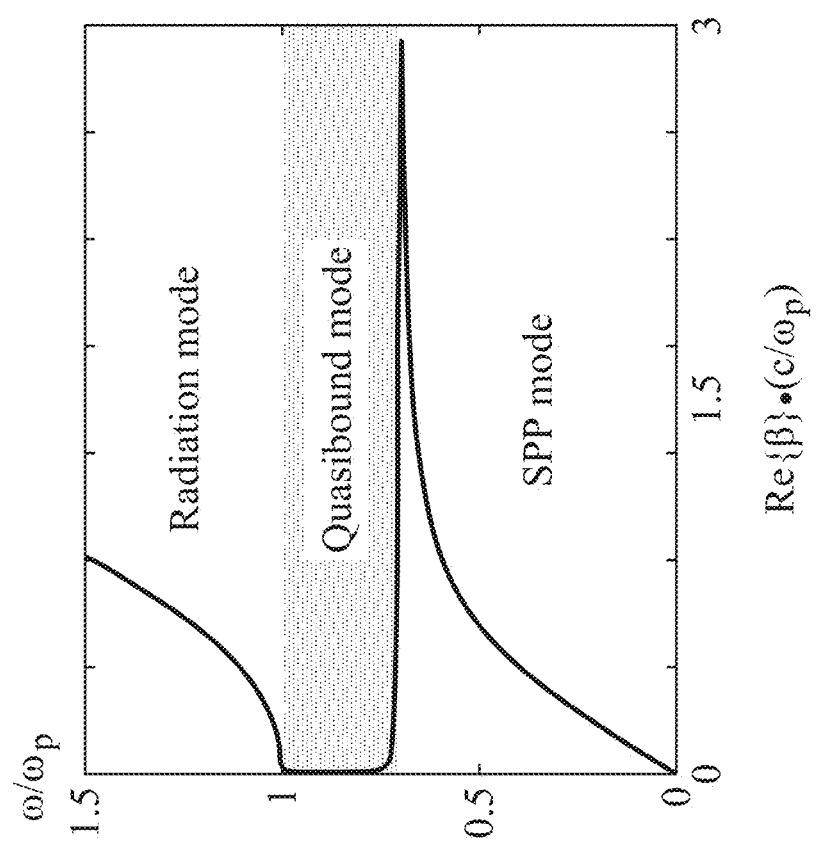
FIG. 6 is a graphical representation of the propagation mode according to aspects of the present disclosure.

As illustrated in FIG. 6, the strongest SPP effect occurs when the real part of the dielectric function is close to minus one (−1) also denoted Re[$\varepsilon_r$]~−1. No propagating mode is found in the range of −1<Re[εr]<0. Thus, in some embodiments as discussed herein the real component of the dielectric function of the absorber layer is desired to be about −1. For the present disclosure the term "about" as in "about −1" includes those values within 15% above and below −1. The imaginary part of the dielectric function may be desired to be as small as possible. It is noted that FIG. 6 may be applied across various source frequencies. In other words, in any one of EUV, DUV, etc., it may be desired in some embodiments to provide a real part of the dielectric function close to about −1. A discussion of the models providing for the generation of FIG. 6 is provided below.

A basic model of optical properties of materials is the Drude Model. (It is noted that other models, including those based upon and extending from the Drude Model are also available and may be used to determine the optical properties of the material). In an embodiment, the dielectric function of a given absorption layer material can be described by Drude model. The Drude Model may be represented by the following expression with respect to permittivity of a material for a frequency:

$$\varepsilon_{rm}(\omega) = 1 - \frac{\omega_p^2}{\omega^2 + i\frac{\omega}{\tau}}$$

where ωp is the plasma frequency, τ is the scattering frequency, ω is frequency. From this model, it is apparent that the dielectric constant or more accurately dielectric function for a material is dependent upon the frequency of the field applied (e.g., the strength of the electric field).

Further, the propagation constant can be provided by the following expression:

$$\beta = \frac{\omega}{c}\sqrt{\frac{\varepsilon_{rm}\varepsilon_{rd}}{\varepsilon_{rm} + \varepsilon_{rd}}}$$

where the relative permittivity of the metal is provided by εrm, the relative permittivity of the dielectric by εrd, ω is frequency, c is the speed of light in free space. By solving the boundary condition of Maxwell's equations, the propagation constant of SPP wave is obtained as shown in the equation above.

Thus, it will be appreciated that the dielectric function is dependent upon the frequency of the radiation. While in some embodiments, a dielectric function with a real part near −1 is desired for a given wavelength of incident radiation (e.g., wavelength centered around 193 nm or DUV lithography), the method and/or material achieving said real part value of the dielectric function may be different dependent upon the frequency of radiation from the source determined in block 102.

In determining the suitable material for the absorber layer in block 106A, in some embodiments, a dielectric material of palladium (Pd) is determined. Pd may be determined to be a suitable material for the absorption layer when using a source (e.g., UV) having a wavelength centered around 193 nanometers (nm). In some embodiments, palladium (Pd) has a dielectric constant (function) $\varepsilon_r$=−1.107−i*1.866, at wavelength of 193 nm, where i is the imaginary unit.

In determining the suitable material for the absorber layer in block 106A, in some embodiments, a dielectric material of nickel (Ni) is determined. Ni may be determined to be a suitable material for the absorption layer when using a source (e.g., UV) having a wavelength centered around 193 nanometers (nm). In some embodiments, Ni has a dielectric function of $\varepsilon_r$=−1.096−i*2.93, at wavelength of 193 nm, where i is the imaginary unit.

In determining the suitable material for the absorber layer in block 106A, in some embodiments, a dielectric material of $TiO_2$ is determined. $TiO_2$ may be determined to be a suitable material for the absorption layer when using a source (e.g., UV) having a wavelength centered around 193 nanometers (nm). In some embodiments, TiO2 has a dielectric function of $\varepsilon_r$=−1.16−i*4.125 at a wavelength of 193 nm at wavelength of 193 nm, where i is the imaginary unit. (natural)

In determining the suitable material for the absorber layer in block 106A, in some embodiments, a doped semiconductor is provided having a real part of the dielectric constant near −1. In an embodiment, the doped semiconductor may be determined to be a suitable material for the absorption layer when using a source (e.g., UV) having a wavelength centered around 193 nanometers (nm). In some embodiments, the doped semiconductor is provided by engineering a semiconductor composition by introducing an n-type dopant. $Re[\varepsilon_r] \sim -1$ can be achieved by doping n-type dopant to increase electron density. This is because the DC conductivity $\sigma_0$ of the material is proportional to electron density (n). Increasing the electron density (n) can effectively reduce the dielectric as shown in the following equations:

$$\sigma_0 = ne^2\tau/m_0$$

$$\sigma(\omega) = \frac{\sigma_0}{1 - i\omega\tau}$$

$$\varepsilon_r(\omega) \equiv \varepsilon_{r0} - \frac{\sigma(\omega)}{i\omega\varepsilon_0}$$

The dielectric constant of semiconductor can be therefore engineered by doping n-type dopant. One can design for any semiconductor to achieve $Re[\varepsilon_r] \sim -1$ by intentionally increasing the electron density using the following equation.

$$n = \frac{\varepsilon_0 m_0}{e^2}\left(\omega^2 + i\frac{\omega}{\tau}\right)(\varepsilon_{r0} + 1)$$

where n is electron density, ε0 is permittivity in vacuum, εr is relative permittivity, τ is the scattering frequency, ω is frequency, m is mass. Exemplary semiconductor materials that may be suitably doped include but are not limited to silicon (Si), silicon germanium (SiGe), and InSb. In an embodiment, the InSb composition has an n-type doping of an electron density of about $4.3 \times 10^{48}$ to provide plasma resonance. Exemplary n-type dopants include phosphorus and arsenic.

Thus, in an embodiment, block 106, and block 106A, includes determining the mask design to tune polarization by selecting the composition of the mask layer—absorption layer that increases the SPP generated. In embodiments this is provided by considering the dielectric function of the material (e.g., providing a real part of the dielectric constant near −1) using the aspects of selection discussed above.

The block 106 may also include determining the mask design to tune polarization by selecting the thickness of the absorption material such that it also contributes to the desired tuning of the polarization as illustrated in block 106B. In some embodiments, the thickness of the absorption material can be used to induce and/or affect the plasmonic effect. The plasmonic effect (SPP) can provide for the suppression of transverse magnetic (TM) waves while retaining transverse electric waves as discussed above. In some embodiments, the thinner the absorption layer the shorter the wavelength of the SPP generated.

In an embodiment, the diffraction efficiency of an absorption layer material for a given thickness is determined. In some embodiments, where the TM waves are desired to be suppressed, the thickness point at which the TM waves diffraction efficiency has sufficiently decayed (or gone close to zero) is determined and implemented in the mask. The example of FIGS. 7B, 7C discussed below illustrate a thickness of 200 nm of absorption material provides suppression of the TM waves. In an embodiment, a thickness of about 200 nm of absorption material is provided on the mask.

Figure 8:
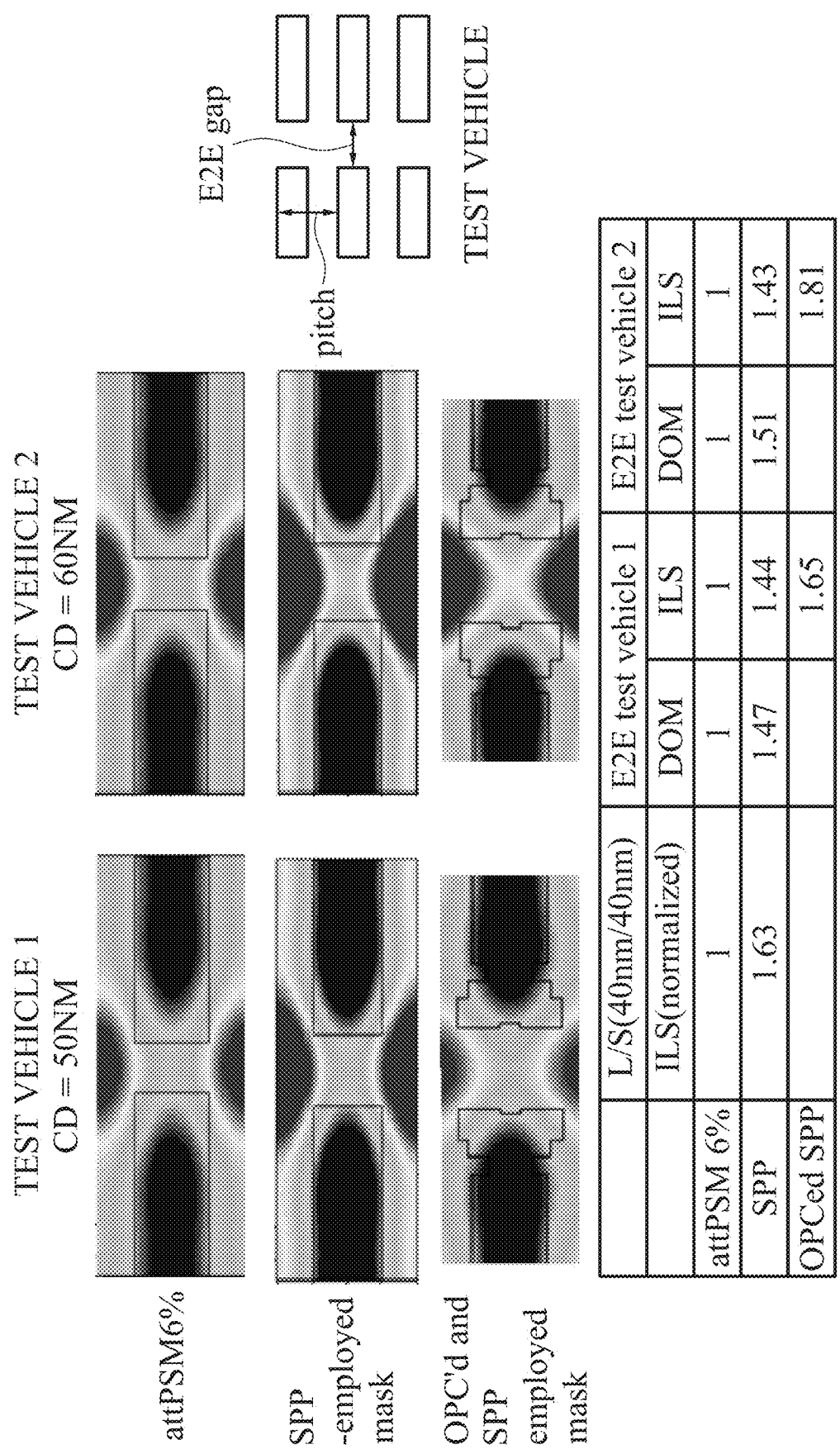
FIG. 8 illustrates exemplary aerial images of various mask types and their relative performance including embodiments according to aspects of the present disclosure.

In some embodiments, after or concurrent with the determination of the mask design as illustrated in block 106, the mask process continues with the performance and/or application of optical proximity correction features in block 108. In an embodiment, the OPC may be rules-based and/or model-based techniques. The OPC features added may include modifications of the design layout such as, modification of line end shapes, addition of sub-resolution assist features, and/or other suitable OPC techniques. In some embodiments of the method 100, block 108 is omitted. In at least some embodiments, applying OPC technique does not decrease the SPP affect provided by the mask design discussed above in block 106. This is illustrated in FIG. 8, discussed below.

After determining the absorption material and/or thickness in block 106 (and in some embodiments, performing the OPC of block 108) the method 100 may be continue to block 110 where the photomask according to the determined design is provided. The provision of the photomask may include fabricating the photomask implementing the determined design and in particular, the determined absorption layer. Exemplary photomasks that may be formed using an absorption layer having a material and/or thickness as discussed above with reference to block 106A and 106B are described below with reference to the exemplary masks of FIGS. 4A and 4B.

Figure 4A:
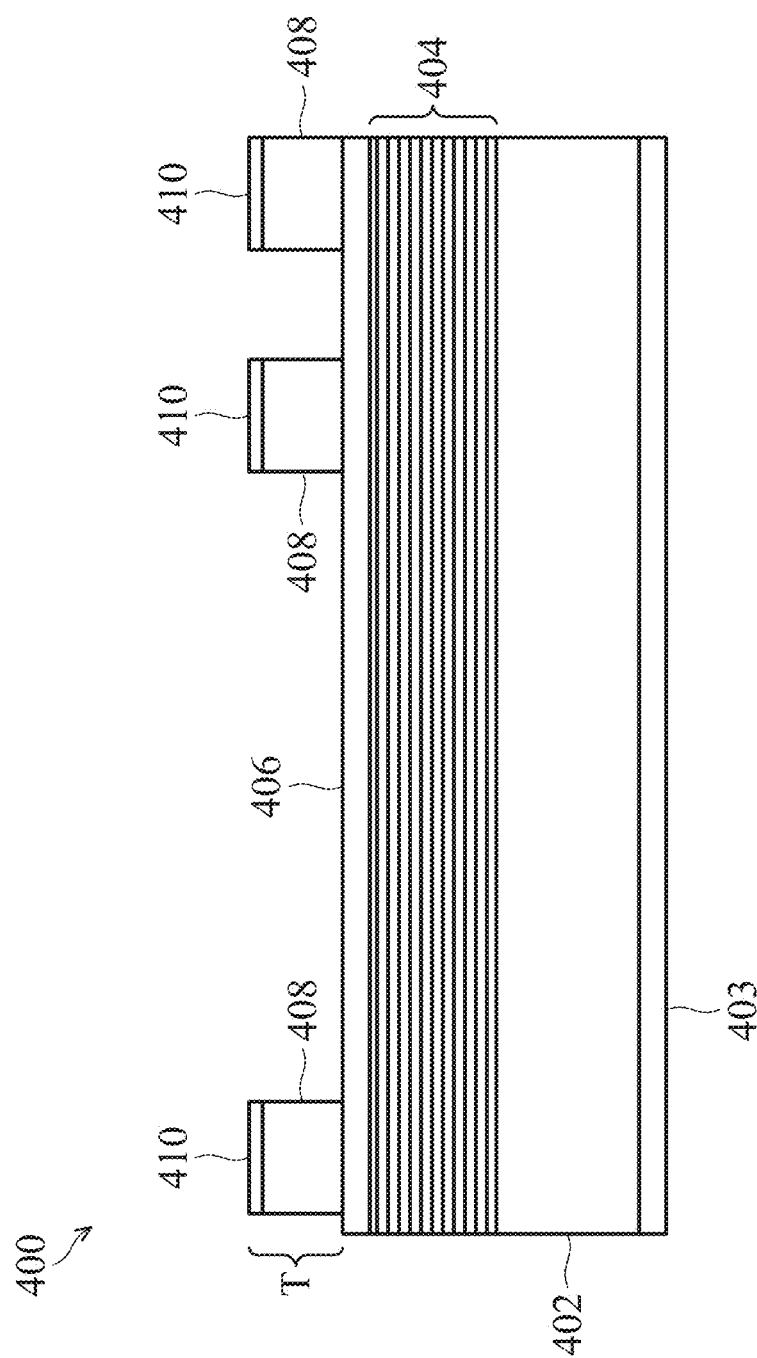
FIG. 4A is an exemplary embodiment of a first mask according to aspects of the present disclosure.
Figure 4B:
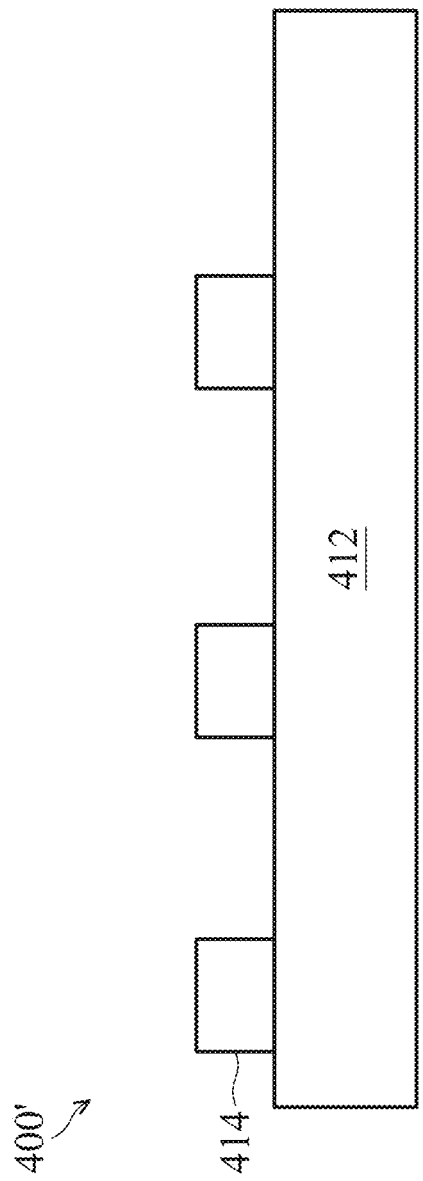
FIG. 4B is an exemplary embodiment of a second type of mask according to aspects of the present disclosure.

FIGS. 4A, 4B are now discussed below and illustrate exemplary masks that may be designed using one or more aspects of the block 106. FIG. 4A illustrates an exemplary EUV mask; FIG. 4B illustrates an exemplary mask for UV or DUV lithography. However, it is reiterated that various lithographic techniques, wavelengths, and mask types may benefit from the present disclosure.

Referring to the example of FIG. 4A, illustrated is a mask 400. The mask 400 is illustrated as an EUV mask, however, as described above, the present disclosure may also apply to masks suitable in other lithography techniques at various other wavelengths. FIG. 4A illustrates an exemplary cross-section of the EUV mask.

As shown in FIG. 4A, the EUV mask 400 may include a substrate 402 having a backside coating layer 403, a multi-layer structure 404, a capping layer 406, and one or more absorption layer features 408 having an anti-reflective coating (ARC) layer 410. In some embodiments, the substrate 402 includes a low thermal expansion material (LTEM) substrate (e.g., such as $TiO_2$ doped $SiO_2$), and the backside coating layer 403 includes a chromium nitride ($Cr_xN_y$) layer. However, other suitable compositions are also possible. By way of example, the multi-layer structure 404 may include molybdenum-silicon (Mo—Si) multi-layers deposited on top of the substrate 402. The multi-layer structure 404 may be formed, for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). However, other configurations may be possible depending on the reflective qualities desired from the multi-layer structure 204. In various embodiments, the capping layer 406 includes a ruthenium (Ru) capping layer. In other embodiments, the capping layer 406 may include a Si capping layer. The capping layer 406 may help to protect the multi-layer structure 404 (e.g., during fabrication of the mask 400) and may also serve as an etch-stop layer for a subsequent absorber layer etch process.

Absorption layer 208 having patterned features is formed over the multi-layer structure 404. The absorption layer 208 is configured to absorb the incident radiation (e.g., EUV light). The material and/or thickness T of the absorption layer 208 may be determined as discussed above with reference to block 106 of the method 100. The absorption layer 208 may be configured such that SPP are maximized or at least increased to provide the desired tuning of the polarization (e.g., suppression of TM). In some embodiments, the absorption layer 208 may have a material selected to provide a composition having a real part of the dielectric function equal to about −1. In some embodiments, the absorption layer 208 includes a thickness T that provides for suppression (low diffraction efficiency) of TM waves. In an exemplary embodiment, the thickness T is 200 nm.

In some examples, the overlying ARC layer 410 includes at least one of a $Ta_xB_yO_zN_u$ layer, a $Hf_xO_y$ layer, or a $Si_xO_yN_z$ layer. In other embodiments, the ARC layer 410 is omitted. While some examples of materials that may be used for each of the substrate 402, the backside coating layer 403, the multi-layer structure 404, the capping layer 406, and the ARC layer 410 have been given, it will be understood that other suitable materials as known in the art may be equally used without departing from the scope of the present disclosure.

For purposes of illustration, an exemplary fabrication method for the mask 400 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). By way of example, a capping layer (e.g., ruthenium) is formed over the multilayer coated substrate followed by deposition of an absorber layer.

The absorption layer is selected according to the aspects of the present disclosure discussed herein. The absorption layer may be deposited by physical vapor deposition (PVD), atomic layer deposition (ALD), chemical vapor deposition (CVD) including for example plasma enhanced CVD, and/or other suitable deposition methods. In some embodiments, introduction of dopants such as n-type dopants as discussed above are also performed for example, by suitable implantation processes such as ion implantation. The mask blank may then be patterned (e.g., the absorber layer is patterned) to form a desired pattern on the mask 400. In some embodiments, an ARC layer may be deposited over the absorption layer prior to patterning. The patterned mask 400 may then be used to transfer circuit and/or device patterns onto a semiconductor wafer as discussed below, particularly those patterns defined by the patterned absorption layer. In various embodiments, the patterns defined by the mask 400 can be transferred over and over onto multiple wafers through various lithography processes. In addition, a set of masks (such as the mask 400) may be used to construct a complete integrated circuit (IC) device and/or circuit.

FIG. 4B, illustrates an exemplary mask 400'. In some embodiments, the mask 400' may be used an optical lithography process such as discussed below with reference to FIG. 5, for example, patterning light of a UV wavelength such as DUV light. In some embodiments, the mask 400' is an attenuating phase shift mask. Transparent substrate 412 may be a quartz substrate, or in some embodiments, fused silica or other material that is substantially transparent to the incident radiation used to expose the photosensitive material. The transparent substrate may use fused silica ($SiO_2$) relatively free of defects, such as borosilicate glass and soda-lime glass. The transparent substrate may use calcium fluoride and/or other suitable materials. The attPSM pattern of the mask 400' is formed by an absorption layer 414.

As stated above, absorption layer 414 configured to absorb the incident radiation. The material and/or thickness T of the absorption layer 414 may be determined as discussed above with reference to block 106 of the method 100. The absorption layer 414 may be configured such that SPP are maximized or at least increased such that the desired polarization (e.g., suppression of TM) is provided. In some embodiments, the absorption layer 414 may have a material selected to provide a real part of the dielectric constant equal to about −1. In some embodiments, the absorption layer 414 includes a thickness T that provides for suppression (low diffraction efficiency) of TM waves. In an exemplary embodiment, the thickness T is 200 nm.

In some embodiments of a method of fabricating the mask 400', a layer of absorption material of the appropriate thickness to provide the desired phase shift and the desired polarization selection is deposited onto the optically transparent substrate. In some embodiments, a layer of chrome or other opaque material is deposited overlying the absorption material. The chrome and the absorption material are patterned and etched to leave the chrome and absorption material in mask locations that are to absorb to the incident radiation. The chrome may then be removed from those portions of the mask that are to be the attPSM patterns (e.g., generally the fine geometry portions of the mask). In some embodiments, the chrome can remain on large geometry patterns that can be accurately formed by opaque (e.g., non-phase shifted) patterns.

In various embodiments, the mask 400' (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to a target semiconductor substrate. The opaque absorbing regions include an absorber layer, as described above, that is configured to absorb incident light (e.g., incident EUV light). The absorption layer may be configured (for example, with a material and/or thickness) according to the present disclosure. Additionally, in some embodiments, the mask 400' may include a PSM which utilizes interference produced by phase differences of light passing therethrough. In some embodiments, the mask 400' is suitable for DUV lithography.

After providing the mask, the method 100 may proceed to block 112 where a lithography patterning process using the provided photomask is used to image the design layout onto a target semiconductor substrate. The lithography process uses the source determined in block 102 (e.g., DUV).

In block 112, radiation (also referred to as light) from the source of block 102 is incident the mask having the design determined in block 106. In an embodiment, 193 nm wavelength radiation is incident a mask having an absorption layer with a composition having a real part of its dielectric function of −1. In a further embodiment, the absorption layer is Pd. As also discussed above, the absorption layer may have a thickness determined to provide polarization selection during irradiation, for example, 200 nanometers.

During irradiation of the mask, SPPs are excited along the absorption layer surface. In some embodiments, the SPP are excited on a sidewall of the absorption layer features. This may result in a high reflection of TE polarization and suppression of TM polarization. For example, while not limited to any specific theory, this may be due to the high effective index of refraction of SPPs, which are excited only when electric fields are oriented perpendicular to the sidewall of absorber. It is noted that in some embodiments, the sidewall where the SPP are excited may be an end of the absorption layer feature adjacent an edge-to-edge gap such as the gap 204 of FIG. 2. The SPP serve to suppress an associated polarization by in affect 'canceling out' the corresponding wave.

Thus, during the radiation a selective polarization can be provided by the mask. Shielding of an undesired polarization (e.g., TM) is provided without additional consideration of the complexity of the layout as the polarization is performed by the patterned absorption layer itself. Exemplary apparatus and methods for performing the irradiation of block 112 are discussed below.

Figure 5:
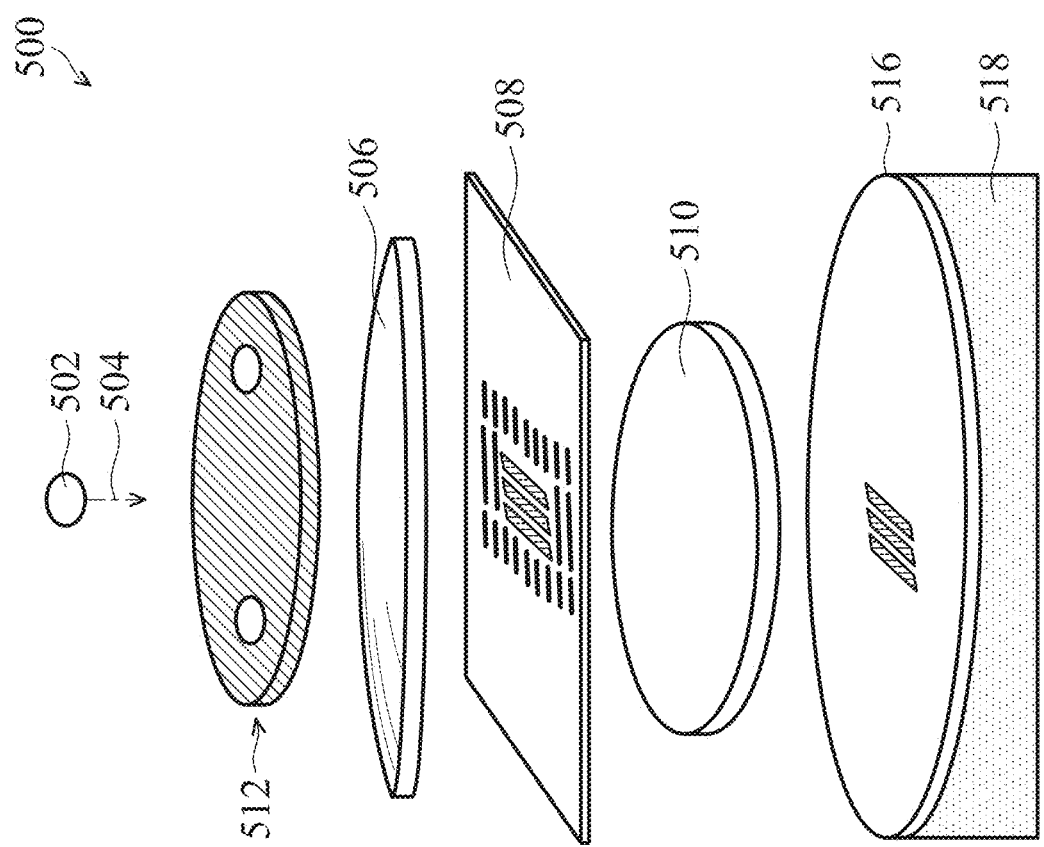
FIG. 5 is an exemplary embodiment of a lithography system used in aspects of the present disclosure.

Illustrated in FIG. 5 is a simplified schematic view of a lithography system 500, in accordance with some embodiments. In various embodiments, a mask such as discussed above is utilized within the lithography system 500. The lithography system 500 includes a radiation source (or illumination source) 502. In some embodiments, the lithography system 500 includes a UV lithography system designed to expose a resist layer by DUV light. Inasmuch, in various embodiments, the resist layer includes a material sensitive to the light (e.g., a DUV resist). The radiation source 502 may be any suitable radiation source. For example, the radiation source 502 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other radiation sources having a desired wavelength (e.g., below approximately 100 nm). It is understood that in the above description of radiation sources, each radiation source may have a certain wavelength distribution rather than an exact single wavelength. In an embodiment, the radiation source 502 provides a light having a wavelength centered around 193 nm. The radiation source 502 may include an optical source selected from the group consisting of ultraviolet (UV) source, deep UV (DUV) source, extreme UV (EUV) source, and X-ray source. The light 504 is generated from the source 502.

The lithography system 500 includes a condenser lens 506. The condenser lens 506 may comprise a single lens element or multiple lens elements, and may include micro-lens arrays, shadow masks, and/or other structures designed to aid in directing light from the radiation source 502 onto a photomask (e.g., photomask 508). The lithography system 500 further includes an objective lens 510. The objective lens 510 may have a single lens element or multiple lens elements. Each lens element may include a transparent substrate and may further include a plurality of coating layers. The transparent substrate may be made of fused silica ($SiO2$), calcium-fluoride ($CaF2$), lithium fluoride (LiF), barium fluoride ($BaF2$), or other suitable material. The materials used for each lens element may be chosen based on the wavelength of the radiation 504 used in the lithography system 500 to minimize absorption and scattering. The condenser lens 506 and the objective lens 510 are collectively referred to as an imaging lens. The imaging lens may further include additional components such as an entrance pupil and an exit pupil to form an image defined in a photomask (e.g., photomask 508) onto a substrate (e.g. substrate 516) to be patterned.

In an embodiment, the mask 508 is substantially similar to the mask 400', discussed above with reference to FIG. 4B. During a lithography patterning process, a photomask (also referred to as a mask or a reticle) 508 may be included in the lithography system 500. In an embodiment, the mask 508 is a transmissive mask that may include a transparent substrate and a patterned absorption layer. The patterned absorption layer may be formed using a plurality of processes and a plurality of materials, such as discussed above with reference to absorption layer. A radiation beam, such as the radiation 504, may be partially or completely blocked when directed onto an absorption region. The absorption layer may be patterned to have one or more openings through which a radiation beam may travel without being absorbed by the absorption layer, thereby creating a patterned radiation beam. In another embodiment, the mask 508 is a reflective mask such as discussed above with reference to FIG. 4A and the mask 400, and for use with a EUV radiation 504. In such an embodiment, the mask 508 selectively absorbs some portions and reflects other portions of the radiation beam such as the radiation 504, thereby creating a patterned radiation beam.

The lithography system 500 may further include a mask stage capable of securing and moving the mask 508 in translational and rotational modes. The lithography system 500 may further include a substrate stage 518 capable of securing and moving a substrate 516 in translational and rotational modes such that the substrate 516 may be aligned with the mask 508. The substrate 516 may be a semiconductor wafer comprising an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or any combination thereof. The substrate 516 may have a photosensitive coating layer (e.g., photoresist) formed thereon during the lithography process. An exemplary photoresist includes chemical amplification resist (CAR). Once the mask 508 and the substrate 516 are aligned, an exposure process may be performed to form an image of the main patterns onto the substrate 516.

The lithography system 500 may also incorporate other techniques and components. For example, the lithography system may also include components and mechanism to implement an immersion lithography process.

In some embodiments, a diffractive optical element (DOE) 512 may be positioned between the radiation source 502 and the condenser lens 506 or other possible locations. The DOE 512 includes a plate with a one or more pairs of poles for achieving off-axis illumination, particularly, a dipole illumination in this example. The plate is opaque to the radiation 504 so that the radiation illuminated on the plate will be blocked from transmitting through. The plate may be made of a metal, metal alloy, or other proper material. The plate may have a circular perimeter defining a center to be aligned with the optical axis during a lithography process. A plurality of diametrical axis can be defined crossing the center (e.g., crossing perpendicular to the optical axis) of the plate. The poles are transmissive to the radiation 112, and may include transparent or translucent materials, an opening, and/or other suitable material. The poles may be designed in various shapes (e.g., circular, curvy, polygonal), sizes, positions, and angles in order to direct the performance of the lithography system 500.

It is noted that is some embodiments, the lithography system 500 does not need to include the polarization of the light provided by the system 500 because the use of a mask 508 is selected such as discussed above with reference to the masks 400 and 400' to provide the relevant functionality.

As discussed above, the lithography system 500 also includes the substrate stage 518 to secure the semiconductor substrate 516 to be patterned. In various embodiments, the semiconductor substrate 516 includes a semiconductor wafer, such as a silicon wafer, germanium wafer, silicon-germanium wafer, III-V wafer, or other type of wafer as known in the art. The semiconductor substrate 516 may be coated with a resist layer (e.g., an EUV resist layer) sensitive to radiation of the wavelength of the source. The semiconductor substrate 516 may also be referred to herein as a target substrate. In the embodiments described herein, the various subsystems of the lithography system 500, including those described above, are integrated and are operable to perform lithography exposing processes including lithography processes. To be sure, the lithography system 500 may further include other modules or subsystems which may be integrated with (or be coupled to) one or more of the subsystems or components described herein.

The method 100 may include other steps not specifically enumerated and/or continue to provide other steps including using the imaged pattern on the target substrate to form semiconductor devices such as integrated circuits.

Illustrated in FIGS. 7A, 7B, and 7C are graphical representations of some embodiments of experimental such as simulation results of various lithography processes. The lithography processes implemented were 193 nm DUV processes. FIG. 7A shows a comparison of diffraction efficiency for TE and TM of various mask types with an x-axis of line width (nanometers). The test vehicle was a line-space feature such as illustrated in FIG. 2 with a pitch of 80 nanometers. The solid line 702 illustrates the diffraction efficiency over a plurality of line widths for a mask fabricated according to one or more aspects of the present disclosure. That is, the mask defining the results of line 702 includes an absorption layer tuned to suppress the TM waves (as illustrated by line 702A) while maintaining the TE waves (as illustrated by 702B). Also plotted for comparison is a performance of a typical attPSM (6% transmission) illustrated as line 704. As illustrated by line 704A, the TM waves are not suppressed as they are in line 702A.

FIG. 7B shows the diffraction efficiencies as a function of absorption layer thickness. Zero Order and First Order responses are illustrated. The TM polarization decays (when SPP wavelength becomes sufficiently strong enough to suppress the TM waves) as the thickness of the absorption layer increases while TE polarizations exhibit swing curves due to destructive/constructive interference.

FIG. 7C shows the diffraction efficiencies for various dielectric constants at a radiation wavelength of 193 nm. Line 706 illustrates a first test case with a material having a real part of the dielectric function of about −1.1 (dielectric function=$\varepsilon r$=−1.1−i*0.95); line 708 illustrates a material having a real part of the dielectric function of about −1.0 (dielectric function $\varepsilon r$=−1.0−i*0.8); line 710 illustrates a material having a real part of the dielectric function of about −1.107 (dielectric function $\varepsilon r$=−1.107−i*1.866). In an embodiment, line 710 represents use of Pd as an absorption layer.

Referring now to FIG. 8, illustrated normalized experimental simulation results for a test vehicle substantial similar to the pattern layout illustrated above with reference to FIG. 2. Aerial images of a first test vehicle and a second test vehicle are show for three masks—a typical attPSM mask, an SPP-employed mask which may be designed using aspects discussed above with reference to block 106, and an OPC'd SPP employed mask, which may be substantially similar to as discussed above with reference to block 106 in conjunction with block 108. The table below the aerial images in FIG. 8 shows the relative performance with respect to image log-slope (ILS) and DOM, normalized to the conventional attPSM mask. The ILS of L/S (line space) feature is improved by about 60% in contrast to attPSM6% while ILS of E2E feature (edge to edge) is improved by about 40%. ILS illustrates how good an image is, larger values may be preferred.

With respect to the description provided herein, the present disclosure offers methods and devices that make use of surface plasmonic polaritons (SPPs) to select or tune the desired polarization using the mask element. The formation of aerial image shows a better image contrast than conventional masks. The mask, in particular in some embodiments, the absorption layer, can act as a polarizer, selecting TE polarizations and blocking TM ones. In some embodiments, to generate the SPP to perform the polarization is accomplished by determining and selecting a material having a real part of its dielectric function of about −1 at the radiation wavelength. The suppression of TM polarization by the mask can occur due to the high effective index of refraction of SPPs, which are excited when electric fields are oriented perpendicular to the sidewall of the patterned absorption layer. This can allow for shielding undesired polarization regardless of the complexity of layout configuration. Further, in some embodiments, as the polarizer function is provided by the mask, there may be no need for a separate design or implementation effort for additional polarizer device in the lithography equipment as the polarization selection is inherently embedded in the layout absorber itself.

One skilled in the art will recognize other benefits and advantages of the methods and structures as described herein, and the embodiments described are not meant to be limiting beyond what is specifically recited in the claims that follow.

Thus, embodiments of the present disclosure described a method of semiconductor device fabrication. The method comprises selecting a lithography source having radiation of a wavelength. A material having a real part of its dielectric function of about −1 at the wavelength is determined (composition). The material is formed on a mask substrate and then patterned according to a layout design. The patterned material is used to image a pattern associated with the layout design onto a semiconductor substrate.

In some embodiments, discussed is an alternative method includes providing a photomask having a patterned absorption layer over a substrate. The photomask is irradiated with a beam having a mixture of transverse electronic (TE) waves and transverse magnetic (TM) waves. The irradiating includes generating surface plasmonic polaritons (SPP) on a sidewall of the patterned absorption layer. The SPP is used to suppress the TM waves while reflecting the TE waves. A target substrate is exposed to TE waves.

In addition, some embodiments discussed a photomask including a substrate and a patterned absorption layer formed over the substrate. The patterned absorption layer has a composition with a real part of a dielectric function of about −1. The patterned absorption layer defines a pattern associated with a semiconductor integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
selecting a lithography source having radiation of a wavelength centered around 193 nanometers (nm);
determining a composition having a dielectric function with a real part of about −1 at the wavelength;
forming a layer of the composition on a mask substrate;
patterning the layer according to a layout design; and
irradiating the patterned layer with radiation of the wavelength, wherein the irradiating includes:
absorbing a least a portion of the radiation by the patterned layer; and
imaging a pattern associated with the layout design and defined by the patterned layer onto a semiconductor substrate.

2. The method of claim 1, further comprising:
determining a thickness of the layer to provide for surface plasmonic polaritons (SPPs) during the irradiating.

3. The method of claim 1, further comprising:
performing an optical proximity correction technique after the determining the composition.

4. The method of claim 1, wherein the irradiating includes:
irradiating the patterned layer with the radiation having a first polarization and a second polarization; and
wherein the absorbing the least a portion of the radiation includes suppressing the second polarization using the patterned layer.

5. The method of claim 4, wherein the first polarization is transverse electric (TE) waves.

6. The method of claim 5, wherein the second polarization is transverse magnetic (TM) waves.

7. The method of claim 1, wherein the determining the composition includes selecting palladium (Pa).

8. The method of claim 1, wherein irradiating includes:
providing surface plasmonic polaritons (SPP) waves on a surface of the patterned layer.

9. The method of claim 8, wherein the SPP waves are formed on a sidewall surface of the patterned layer.

10. The method of claim 9, wherein the sidewall surface defines an edge of the patterned layer adjacent a gap.

11. The method of claim 1, wherein the determining the composition includes doping a semiconductor composition with an n-type dopant.

12. A method of semiconductor device fabrication, comprising:
providing a photomask having a patterned absorption layer over a semiconductor substrate having a photosensitive material formed thereon;
irradiating the photomask with a beam from an ultraviolet source having a mixture of transverse electronic (TE) waves and transverse magnetic (TM) waves, wherein the irradiating including generating surface plasmonic polaritons (SPP) on a sidewall of the patterned absorption layer;
using the SPP to suppress the TM waves while reflecting the TE waves; and
exposing portion of the photosensitive material of the semiconductor substrate using the TE waves.

13. The method of claim 12, further comprising:
determining a composition of the patterned absorption layer to provide for the generating SPP.

14. The method of claim 13, wherein the composition has a dielectric function with a real part of about −1.

15. The method of claim 14, wherein the composition is palladium having the real part of −1.1.

16. The method of claim 12, further comprising:
performing an optical proximity correction (OPC) technique on the provided mask.

17. A method of semiconductor device fabrication, comprising:
selecting a lithography source having radiation of a wavelength;
determining a composition having a dielectric function with a real part of about −1 at the wavelength;
forming a layer of the composition on a mask substrate;
patterning the layer according to a layout design; and
irradiating the patterned layer with radiation of the wavelength, wherein the irradiating includes:
irradiating the photomask with a beam having a mixture of transverse electronic (TE) waves and transverse magnetic (TM) waves, wherein the irradiating includes generating surface plasmonic polaritons (SPP);
using the SPP to suppress the TM waves while reflecting the TE waves; and
exposing a target substrate using the TE waves to image a pattern associated with the layout design and defined by the patterned layer onto a semiconductor substrate.

18. The method of claim 17, wherein determining the composition includes selecting palladium (Pa).

19. The method of claim 17, wherein the SPP waves are formed on a sidewall surface of the patterned layer.

20. The method of claim 17, wherein the determining the composition includes doping a semiconductor composition with an n-type dopant.

* * * * *